United States Patent
Kang

(10) Patent No.: US 8,193,057 B2
(45) Date of Patent: Jun. 5, 2012

(54) MOS TRANSISTOR FOR REDUCING SHORT-CHANNEL EFFECTS AND ITS PRODUCTION

(75) Inventor: Xiaoxu Kang, Shanghai (CN)

(73) Assignee: Shanghai IC R&D Center, Shanghai (CN)

( * ) Notice: Subject to any disclaimer, the term of this patent is extended or adjusted under 35 U.S.C. 154(b) by 24 days.

(21) Appl. No.: 12/946,162

(22) Filed: Nov. 15, 2010

(65) Prior Publication Data

US 2011/0059588 A1    Mar. 10, 2011

Related U.S. Application Data

(62) Division of application No. 12/062,851, filed on Apr. 4, 2008, now abandoned.

(30) Foreign Application Priority Data

Apr. 6, 2007    (CN) .......................... 2007 1 0039186

(51) Int. Cl.
*H01L 21/336*    (2006.01)
(52) U.S. Cl. .......................... 438/259; 438/270; 257/622
(58) Field of Classification Search .................. 438/259, 438/270; 257/622
See application file for complete search history.

(56) References Cited

U.S. PATENT DOCUMENTS

| | | | |
|---|---|---|---|
| 4,065,783 A * | 12/1977 | Ouyang | 257/334 |
| 4,939,100 A | 7/1990 | Jeuch et al. | |
| 5,448,094 A | 9/1995 | Hsu | |
| 5,712,503 A | 1/1998 | Kim et al. | |
| 6,130,454 A | 10/2000 | Gardner et al. | |
| 6,956,263 B1 | 10/2005 | Mistry | |
| 6,977,415 B2 | 12/2005 | Matsuo | |
| 7,081,652 B2 | 7/2006 | Oishi | |
| 7,125,779 B2 | 10/2006 | Inaba | |
| 7,436,035 B2 | 10/2008 | Murthy et al. | |
| 7,622,764 B2 | 11/2009 | Jung | |

* cited by examiner

*Primary Examiner* — Eugene Lee
(74) *Attorney, Agent, or Firm* — Wenye Tan

(57) ABSTRACT

The invention is related to a MOS transistor and its fabrication method to reduce short-channel effects. Existing process has the problem of high complexity and high cost to reduce short-channel effects by using epitaxial technique to produce an elevated source and drain structure. In the invention, the MOS transistor, fabricated on a silicon substrate after an isolation module is finished, includes a gate stack, a gate sidewall spacer, and source and drain areas. The silicon substrate has a groove and the gate stack is formed in the groove. And the process for the MOS transistor includes the following steps: forming the groove; carrying out well implantation, anti-punchthrough implantation and threshold-voltage adjustment implantation; forming the gate stack in the groove which comprising patterning the gate electrode; carrying lightly doped drain implantation and halo implantation; forming the gate sidewall spacer; carrying source and drain implantation to get the source and drain areas; forming a metal silicide layer on the source and drain areas.

5 Claims, 3 Drawing Sheets

MOS TRANSISTOR FOR REDUCING SHORT-CHANNEL EFFECTS AND ITS PRODUCTION

This application is a divisional application of U.S. patent application Ser. No. 12/062,851, filed on Apr. 4, 2008, which claims the priority of Chinese patent application no. 200710039186.1, filed on Apr. 6, 2007, the entire contents of all of which are incorporated herein by reference.

BACKGROUND OF THE INVENTION

1. Field Of The Invention

The invention relates to semiconductor product and, more particularly, to a metal-oxide semiconductor (MOS) transistor for reducing short-channel effects.

2. Description of Related Art

Semiconductor devices can work faster by scaling down their dimensions. Therefore the channel length of a metal-oxide semiconductor (MOS) transistor is being scaled down. However, short-channel effects will arise when the channel length shortened to a certain degree, leading to the worsening of device performance, even malfunctioning. The short-channel effects can be reduced by decreasing the thickness of a gate insulation layer or producing a source and drain structure with shallow junctions. However, the thinness of the existing gate insulation layer has approached a limit; that is, when further decreasing the thickness, an increasing leakage current even a breakdown will easily arise in the gate. Therefore, further decreasing the thickness of a gate insulation layer is not an effective method for reducing the short-channel effects. In addition, by producing a source and drain structure with shallow junctions to reduce the short-channel effects is also difficult to achieved.

For reducing the short-channel effects, an epitaxial technique is usually used to produce an elevated source and drain structure. However, the epitaxial technique is difficult to control and has the problem of high complexity, high cost, high defect density, etc.

SUMMARY OF THE INVENTION

An objective of the invention is to provide a metal-oxide semiconductor (MOS) transistor for reducing short-channel effects and its fabrication method. It makes a gate stack in a groove lower than the top surface of source and drain areas to get a relative elevated source and drain structure. And thereby the short-channel effects can be effectively reduced with less technology difficulty and cost. Furthermore, the height of the gate stack can be reduced to provide a larger process window for the subsequent process of pre-metal dielectric deposition.

To achieve the above objective, the invention provides a MOS transistor for reducing short-channel effects. The MOS transistor is fabricated on a silicon substrate after an isolation module is finished, and the MOS transistor includes a gate stack and source and drain areas. Wherein the silicon substrate has a groove and the gate stack is formed in the groove.

In the MOS transistor for reducing short-channel effects, the bottom of the groove is lower than the top surface of the source and drain areas.

In the MOS transistor for reducing short-channel effects, the area of the groove is not less than that of the gate stack.

The MOS transistor for reducing short-channel effects further includes a lightly doped drain (LDD) structure.

The MOS transistor for reducing short-channel effects further includes a halo implantation structure.

In the MOS transistor for reducing short-channel effects, the gate stack comprises a gate insulation layer and a gate electrode which are layered.

The MOS transistor for reducing short-channel effects further includes a metal silicide layer which is formed on the source and drain areas.

To achieve the above objective, the invention provides a fabrication method of a MOS transistor for reducing short-channel effects, which is fabricated on a silicon substrate after an isolation module is finished. The method includes the following steps: (1) forming a groove in the silicon substrate; (2) carrying out well implantation, anti-punchthrough implantation and threshold-voltage-adjustment implantation; (3) forming a gate stack in the groove, wherein the gate stack includes a gate insulation layer and a gate electrode, which are layered; (4) carrying out lightly doped drain implantation and halo implantation; (5) forming a gate sidewall spacer; (6) carrying out source and drain implantation to get source and drain areas; (7) forming a metal silicide layer on the source and drain areas.

In the fabrication method of a MOS transistor for reducing short-channel effects, Step (3) includes patterning the gate structure in the groove.

In the fabrication method of a MOS transistor for reducing short-channel effects, Step (1) includes the following steps: (10) patterning the groove corresponding to the gate stack by photolithography; (11) forming the groove by etching; (12) optimizing the surface of the silicon substrate.

In the fabrication method of a MOS transistor for reducing short-channel effects and in Step (11), the groove is formed by wet etching.

In the fabrication method of a MOS transistor for reducing short-channel effects and in Step (12), the surface of the silicon substrate is optimized by oxidation and wet etching.

BRIEF DESCRIPTION OF THE DRAWINGS

These and other features, aspects, and advantages of the present invention will become better understood with regard to the following description, appended claims, and accompanying drawings.

DETAILED DESCRIPTION OF THE INVENTION

The metal-oxide semiconductor (MOS) transistor for reducing short-channel effects and its fabrication of the invention will be described in detail thereinafter.

Figure 1:
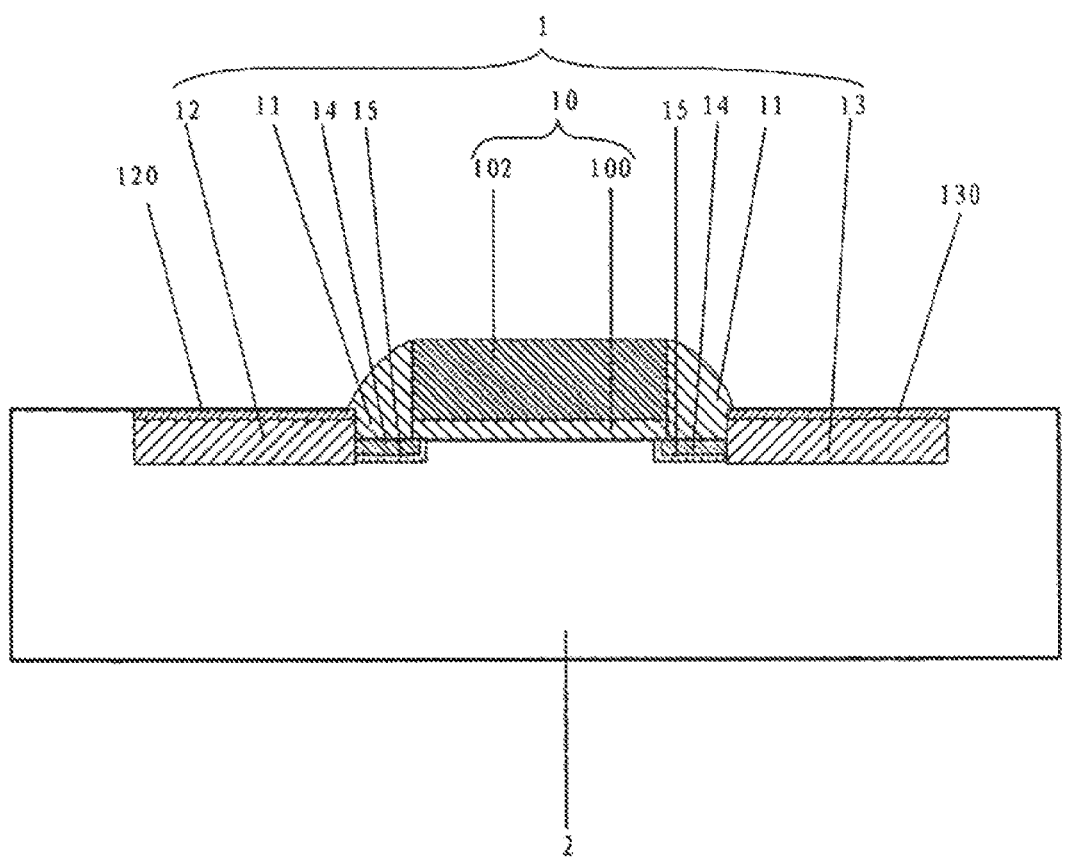
FIG. 1 is a cross-sectional view showing the MOS transistor for reducing short-channel effects according to an embodiment of the invention.

As shown in FIG. 1, the MOS transistor 1 for reducing short-channel effects is produced on a silicon substrate 2 after an isolation module is finished. The MOS transistor 1 includes a gate stack 10, gate sidewall spacer 11, source 12 and drain 13 areas, lightly doped drain (LDD) structures 14, and halo implantation structures 15.

The gate stack 10 includes a gate insulation layer 100 and a gate electrode 102. The silicon substrate 2 has a groove 20 (shown in FIG. 4) for receiving the gate stack 10, wherein the bottom of the groove 20 is lower than the top surface of the source 12 and drain 13 areas. Thereby the gate stack 10 formed in the groove 20 will have a bottom surface lower than the top surface of the source 12 and drain 13 areas to get a relative elevated source and drain structure. In addition, the area of the groove 20 is not less than that of the gate stack 10 and the gate stack 10 is formed in the groove 20.

The gate sidewall spacer 11 are formed on both sides of the gate stack 10 to ensure electrode insulation.

The source 12 and the drain 13 are formed in the silicon substrate 2 and flank the gate stack 10. The metal silicide layers 120 and 130 are respectively formed on the source 12 and the drain 13.

In one embodiment of the invention, the isolation module is formed by the technology of shallow trench isolation (STI); the gate insulation layer 100 is made of silicon-based dielectric; the gate electrode 102 is a polysilicon gate; and the gate sidewalls spacer 11 are made of silicon oxide and nitride.

The LDD structures 14 and halo implantation structures 15 can reduce the short-channel effects to a certain degree, but do not achieve the most desirable effects. In an embodiment of the invention, by the groove 20 the channel of the MOS transistor 1 is lower than the top surface of the source 12 and drain 13 areas, therefore the short-channel effects is reduced effectively.

Figure 2:
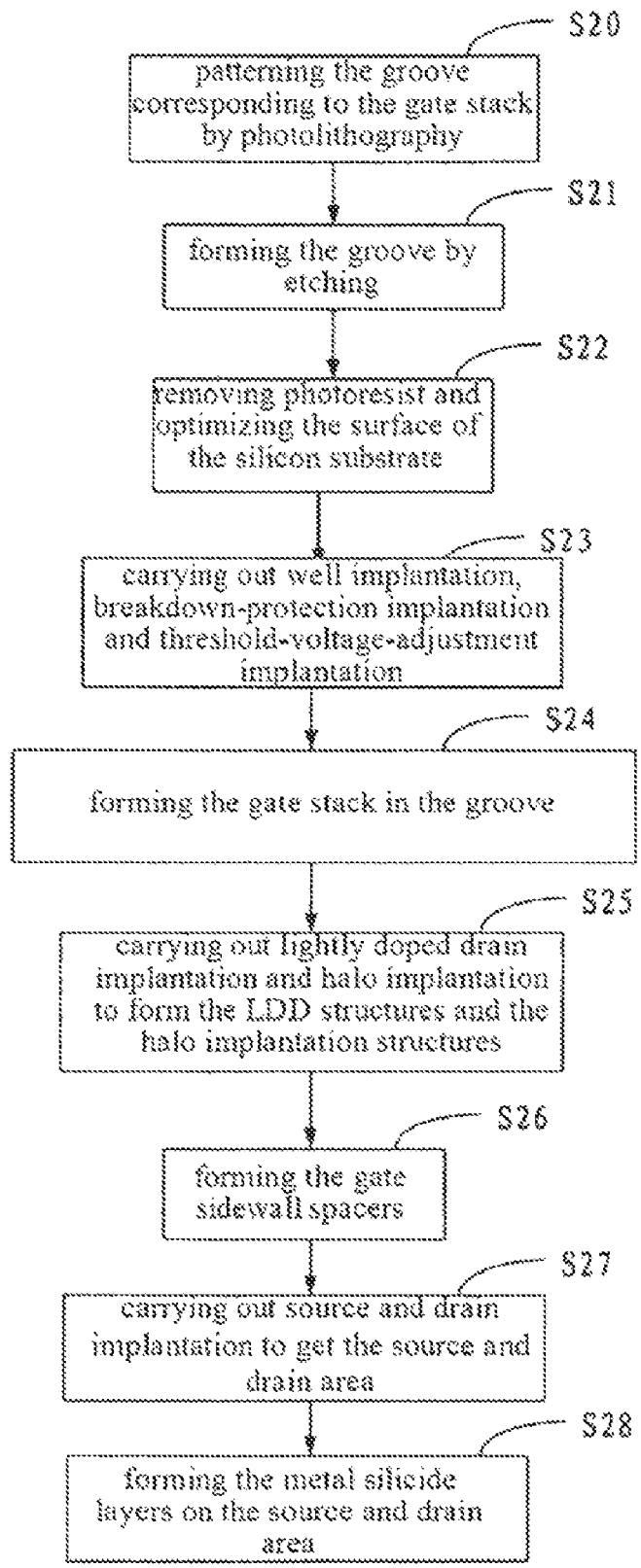
FIG. 2 is a flow chart of the MOS transistor fabrication for reducing short-channel effects according to the embodiment of the invention.
Figure 3:
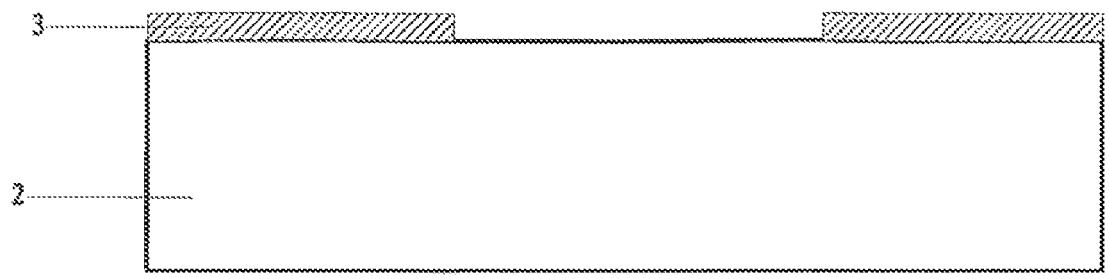
FIG. 3 is a cross-sectional view showing the silicon substrate after Step S20 in FIG. 2.

Refer to FIG. 2, which is a flow chart of the manufacturing method of the MOS transistor 1. First carry out Step S20, patterning the groove 20 corresponding to the gate stack 10 by photolithography. Refer to FIG. 3, which is a cross-sectional view showing the silicon substrate 2 after Step S20. As shown in FIG. 3, a photoresist film 3 with the pattern of the groove 20 covers the silicon substrate 2.

Figure 4:
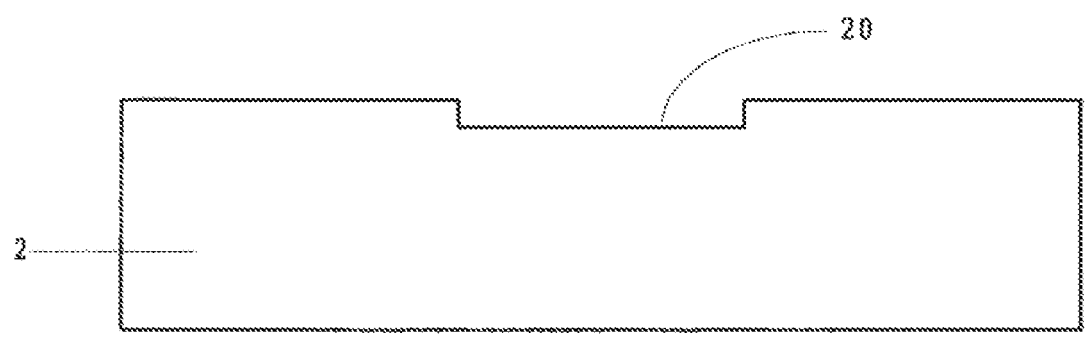
FIG. 4 is a cross-sectional view showing the silicon substrate after Step S21 in FIG. 2.

Then proceed with Step S21, forming the groove 20 by etching. In one embodiment of the invention, the groove 20 is formed by wet etching. Refer to FIG. 4, which is a cross-sectional view showing the silicon substrate 2 after Step S21. As shown in FIG. 4, the groove 20 is formed in the silicon substrate 2.

Then proceed with Step S22, removing photoresist and optimizing the surface of the silicon substrate 2. In one embodiment of the invention, oxidation and wet etching is used to optimize the surface of the silicon substrate 2.

Then proceed with Step S23, carrying out well implantation, anti-punchthrough implantation and threshold-voltage-adjustment implantation.

Then proceed with Step S24, forming the gate stack 10 in the groove 20. The gate stack 10 includes the gate insulation layer 100 and the gate electrode 102. In one embodiment of the invention, the gate stack 10 is formed by photolithography and etching after the deposition of the gate insulation layer 100 and then the gate electrode 102. And Step S24 further includes patterning the gate structure in the groove.

Then proceed with Step S25, carrying out lightly doped drain implantation and halo implantation to form the LDD structures 14 and the halo implantation structures 15.

Then proceed with Step S26, forming the gate sidewall spacers 11.

Then proceed with Step S27, carrying out source and drain implantation to get the source 12 and drain 13 areas.

Then proceed with Step S28, forming the metal silicide layers 120 and 130 on the source and drain areas.

In Step S20 and Step S24, usually two sheets of mask are used to form the needed pattern, and the same mask of different polarity photoresist can also be used. For example, in Step S20 negative photoresist is used and in Step S24 positive photoresist is used. This immensely cuts the cost.

In summary, the MOS transistor for reducing short-channel effects and its fabrication of the invention make the gate stack in a groove lower than the top surface of the source and drain areas to get a relative elevated source and drain structure. This can reduce short-channel effects effectively with less technology difficulty and cost. Furthermore, the height of the gate stack can be reduced to provide a larger process window for the subsequent process of pre-metal dielectric deposition.

What is claimed is:

1. A manufacturing method of a MOS transistor for reducing short-channel effects, the MOS transistor fabricated on a silicon substrate after an isolation module is finished, the method comprising the following steps:
    (1) forming a groove in the silicon substrate;
    (2) carrying out well implantation, anti-punchthrough implantation and threshold-voltage-adjustment implantation;
    (3) forming a gate stack in the groove, wherein the gate stack comprises a gate insulation layer formed on a bottom surface of the groove and a gate electrode layer formed on a top surface of the gate insulation layer;
    (4) carrying out lightly doped drain (LDD) implantation and halo implantation within the groove to create LDD structures and halo structures under the groove;
    (5) forming an insulating gate sidewall spacer with a substantial portion of the gate sidewall spacer located within the groove;
    (6) carrying out source and drain implantation to get source and drain areas;
    (7) forming a metal silicide layer on the source and drain areas.

2. The fabrication method of a MOS transistor for reducing short-channel effects according to claim 1, the step (3) comprising patterning the gate structure in the groove.

3. The fabrication method of a MOS transistor for reducing short-channel effects according to claim 1, the step (1) comprising the following steps:
    (10) patterning the groove corresponding to the gate stack by photolithography;
    (11) forming the groove by etching, wherein a cross-section of the groove is in a shape of a rectangle;
    (12) optimizing the surface of the silicon substrate.

4. The fabrication method of a MOS transistor for reducing short-channel effects according to claim 3, wherein, in Step (11), the groove is formed by wet etching.

5. The fabrication method of a MOS transistor for reducing short-channel effects according to claim 3, wherein, in Step (12), the surface of the silicon substrate is optimized by oxidation and wet etching.

* * * * *